United States Patent [19]

Moore

[11] 4,195,350
[45] Mar. 25, 1980

[54] METHOD AND APPARATUS FOR ELIMINATING DEADBAND IN DIGITAL RECURSIVE FILTERS

[75] Inventor: James K. Moore, Stamford, Conn.
[73] Assignee: CBS Inc., New York, N.Y.
[21] Appl. No.: 916,977
[22] Filed: Jun. 19, 1978
[51] Int. Cl.² .............................................. G06F 7/38
[52] U.S. Cl. .................................. 364/724; 364/745
[58] Field of Search ................. 364/724, 745; 358/36, 358/167; 328/167

[56] References Cited

U.S. PATENT DOCUMENTS

| 3,749,895 | 7/1973 | Kao | 364/745 |
| 3,906,199 | 9/1975 | Kieburtz et al. | 364/745 |
| 4,034,196 | 7/1977 | Butterweck et al. | 364/724 X |
| 4,064,530 | 12/1977 | Kaiser et al. | 358/36 |
| 4,107,739 | 9/1978 | Rossi et al. | 358/167 |

OTHER PUBLICATIONS

Bogner et al., *Introduction to Digital Filtering*, John Wiley & Sons, 1975, pp. 173-174.
Gold et al., *Digital Processing of Signals*, McGraw-Hill Book Company, 1969 pp. 112-116.
Kieburtz, "Rounding & Truncation Limit Cycles in a Recursive Digital Filter," *IEEE Trans. on Acoustics, Speech & S.P.*, Feb. 1974 p. 73.
Claasen, "Effects of Quantization & Overflow in Recursive Digital Filters, "*IEEE Trans. on Acoustics, Speech & Signal Processing*, Dec. 1976 pp. 517-527.

*Primary Examiner*—David H. Malzahn
*Attorney, Agent, or Firm*—Spencer E. Olson

[57] ABSTRACT

Method and apparatus for eliminating deadband effects in digital recursive filters caused by rounding of the quantization of products within the filter, wherein the product is represented by a digital word, consists of truncating the absolute value of the product-representing word to the next lower digit by dropping a number of least significant digits determined by the value of the multiplier and if any of the dropped digits is a "one", adding a least significant "one" to the truncated number while retaining the sign of the pre-truncated word, and repeating the process at the cycling frequency of the filter, until a steady state is reached at which the difference between the input and output of the filter becomes zero. The concept is described as embodied in a digital system utilizing a recursive filter for reducing noise in a color television signal.

4 Claims, 4 Drawing Figures

METHOD AND APPARATUS FOR ELIMINATING DEADBAND IN DIGITAL RECURSIVE FILTERS

BACKGROUND OF THE INVENTION

This invention relates to digital signal processing systems, and is more particularly concerned with the elimination of deadband effects inherent in digital recursive filters caused by rounding of the quantization of products within the filter.

The problem of rounding errors in certain digital signal processing systems, particularly digital filtering systems, has been recognized for some time. Simply stated, rounding errors are encountered when the system is unable to detect a difference between two quantities (e.g., a voltage value) less than a finite amount which, in turn, results in a failure to reach a proper steady state, known in digital filtering parlance as "deadband". The nature of the problem is described on pages 173-174 of *Introduction to Digital Filtering*, R. E. Bogner and A. C. Constantinides, John Wiley & Sons, 1975, and on pages 112-116 of *Digital Processing of Signals*, D. Gold and C. M. Rader, McGraw-Hill Book Company, 1969. The round-off error problem is particularly acute in recursive filters, and will be better appreciated from consideration of the following specific example of a noise reduction system for color television which utilizes a recursive filter.

Commonly assigned U.S. Pat. No. 4,064,530, entitled "Noise Reduction System For Color Television", describes a system which is effective to reduce noise in a color television signal, even in the presence of significant motion between successive frames. The system includes a delay or storage device capable of storing a single television frame and a summing device for adding a fractional amplitude portion of the stored signal to a fractional amplitude portion of the present, or incoming video signal. It functions as a recursive filter and is operative automatically to change the fractional amplitude portion of the stored signal fed back to the summing device as a function of the difference between stored and present signals, thereby to change the integration time constant of the filter so as to accommodate a certain amount of motion between the arriving signal and the stored frames. The system includes a motion evaluation subsystem for detecting motion between stored frames and the incoming signal as the picture proceeds element-by-element through the system, and in response to the evaluation of such motion alters the contribution of the stored past signals to the noise-reduced video output signal. If a picture element from the same scene object in the stored past signals is sufficiently different in amplitude from the same element in the arriving video signal, the past history of that picture is ignored and only the present signal is transmitted to the output terminal; in this case, there would be no signal-to-noise improvement for that particular picture element.

That the described system when implemented in the digital domain is inherently subject to deadband will be evident from closer analysis of the operation of the system with reference to FIG. 1, which is similar to FIG. 1 of the aforementioned patent. Assuming implementation of the system for the NTSC system of color television, a PCM-encoded video input signal on input line 10 is applied via a variable attenuator 12 to one input terminal of an adding or summing circuit 14. The output signal from summer 14 is applied to a delay device 16 having a delay of (525H-$\tau$); H represents one television line interval, which means that the delay device, plus miscellaneous delay $\tau$ in the recirculating loop including the delay device, introduce a one-frame delay, since there are 525 lines per frame in the NTSC system. The output of the delay device is applied via a second variable attenuator 18 to a second input terminal of the summer 14. Attenuators 12 and 18, shown very schematically in FIG. 1, are ganged and respectively introduce a transmission constant of $(1-a)$ and "a"; that is, a fractional portion $(1-a)$ of the amplitude of the arriving video signal is applied as one input to summer 14 and a fractional portion "a" of the amplitude of a stored video signal from delay device 16 is applied to the other summer input. If the value of "a" is increased, the proportion of the stored signal applied to the summer increases and the proportion of arriving video signal applied to the summer decreases. Conversely, if "a" is decreased, a larger proportion of the arriving signal and a smaller proportion of the stored signal are applied to the summer.

Although in FIG. 1 the proportions in which the incoming and stored video signals are summed are complementary with respect to unity to preserve signal amplitude normalization, the system is not necessarily implemented in this way. For example, if the arriving signal is designated x, the signal from delay device 16 is designated y, and the noise-reduced video output signal at the output of summer 14 is designated x', it will be seen that the basic equation of the system is:

$$x' = ay = (1-a)x \qquad \text{Eq.(1)}$$

which by very simple manipulation transforms to $$x' = y + (1-a)(x-y) \qquad \text{Eq.(2)}$$

It will be noted that Equation (2) expresses the noise-reduced video output signal in terms of the input and stored video signals, one of the terms of which is the quantity $(x-y)$, which is the difference between the arriving and stored video. It will also be noted that the right hand side of the equation requires multiplication of two terms, which for ease of digital implementation may be treated as a division of $(x-y)$ by the reciprocal of $(1-a)$; it is axiomatic that rounding errors are introduced whenever division occurs in digital systems.

It will be realized that Equation (2), derived from Equation (1), represents the amplitude normalized form of first-order recursive filter shown in FIG. 1. However, in an alternate form of recursive filter, for example filters of the kind described in the aforementioned text books, the input signal is not multiplied by $(1-a)$; these are a non-normalized form in which for an input level x, the output level y can reach a magnitude of Mx or x divided by $(1-a)$. This is the usual integrator form employed in digital recursive filtering where there may not be a serious amplitude bound as there is in television. In the more usual recursive filter, the equation form is $$x = x + ay$$

which becomes $$x' = y + \left(\frac{Mx - y}{M}\right) \text{ or } y + (1-a)\left(\frac{x}{1-a} - y\right)$$

in which case $$(\frac{x}{1-a} - y)$$

is "forced" to become zero.

The deadband inherent in a recursive filter operating according to Equation (2) will be apparent from the following Table I, which for clarity has been set forth in decimal fashion rather than binary. In Table I, "a" has been assigned a value of 0.9, from which it follows that (1−a) equals 0.1, and further it is assumed that the value of x goes abruptly to zero at T=1 following a sustained period of x=10 up to and including T=0. In other words, at T=0 x and y are both stabilized at a value of 10, and then at T=1 the value of x undergoes a step function, decreasing in value from 10 to zero.

TABLE I $X' = y + (1 - a)(x - y); \quad a = 0.9, \quad (1 - a) = 0.1$

| T | x | y | (x − y) | 0.1 (x − y) | 0.1 (x − y) rounded | X' |
|---|----|----|-----|------|----|----|
| 0 | 10 | 10 | 0   | 0    | 0  | 10 |
| 1 | 0  | 10 | −10 | −1.0 | −1 | 9  |
| 2 | 0  | 9  | −9  | −.9  | −1 | 8  |
| 3 | 0  | 8  | −8  | −.8  | −1 | 7  |
| 4 | 0  | 7  | −7  | −.7  | −1 | 6  |
| 5 | 0  | 6  | −6  | −.6  | −1 | 5  |
| 6 | 0  | 5  | −5  | −.5  | −1 | 4  |
| 7 | 0  | 4  | −4  | −.4  | 0  | 4  |
| 8 | 0  | 4  | −4  | −.4  | 0  | 4  |
| 9 | 0  | 4  | −4  | −.4  | 0  | 4  |
| 10| 0  | 4  | −4  | −.4  | 0  | 4  |
| 11| 0  | 4  | −4  | −.4  | 0  | 4  |
| 12| 0  | 4  | −4  | −.4  | 0  | 4  |
| 13| 0  | 4  | −4  | −.4  | 0  | 4  |

It will be seen that the column headings from left to right are T(time), x(the amplitude of the incoming signal), y(the amplitude of the stored signal), (x−y) (the difference signal), 0.1(x−y) 0.1(x−y)rounded (which by the usual definition is rounding to the nearest integer), and x' (the output signal). By definition, the value of y (which may also be designated an output signal) in each row is the value of x' in the row earlier. Examination of this Table and the curve shown in FIG. 2 will reveal that instead of the x' output signal decaying to zero as the x signal has done, it "deadbands" at a value of four as a consequence of rounding to the nearest integer the product of the multiplication 0.1(x−y).

Although decimal numbers have been employed in Table I to illustrate the point, the same effect occurs in a PCM-encoded system employing multi-bit words. For example, if in an 8-bit encoded system it is desired to divide an 8-bit word by eight, one merely drops the three least significant bits of the word, and if the quotient is to be rounded, if the third least significant bit is a "1" it is added to the fourth least significant bit being retained; if the third least significant bit is a zero it is ignored. Basically, the process is the same as in the decimal system; if the quantity has a value of half or greater, it is rounded to the next higher integer, and if it is less than half it is ignored, thus producing the same deadband phenomena as shown in Table I.

In the noise reducing system of U.S. Pat. No. 4,064,530, deadband due to rounding causes artifacts to appear in the displayed television image, known in the art as the "ground glass" effect. This is caused by small quantizing noise effects which, because they are below the threshold of detectability of the apparatus employed in measuring the difference between the incoming and stored video signals, become "frozen" in the recirculating signal. In other words, because of the nature of the operation of digital recursive filters, small quantizing noise disturbances are literally undetectable mathematically making it impossible for them to decay to zero, or to be changed to some new value for that matter. This effect has nothing to do with the noise-reducing function of the patented system; it is inherent in any digital filter operating in the recursive mode.

It is a primary object of the present invention to eliminate deadband effects in digital recursive filters. A more specific object is to provide an improved digital noise reducing system for color television by eliminating deadband in a system utilizing a recursive filter for noise reduction.

SUMMARY OF THE INVENTION

Briefly, the present invention eliminates deadband effects inherent in a digital recursive filter having an input and an output as a result of rounding of the product resulting from multiplication of a number representing the difference between the input and the output by another number having a value less than one, wherein the product is represented by a digital word which may have either positive or negative sense and which should eventually decay to zero when a steady state is reached. Deadband is eliminated by truncating the absolute value of the product-representing word to the next lower digit by droping a number of least significant digits determined by the value of the multiplier and if any of the dropped digits is a "one" adding a "one" to the absolute value of the truncated digital word while retaining the sign of the pre-truncated word, and repeating the process at the cycling frequency of the filter respectively, a succession of least significant digits until the value of the difference between the input and the output becomes zero. When embodied in a digital system utilizing a recursive filter for reducing noise in a color television signal, the invention minimizes objectionable artifacts otherwise produced in the displayed television image caused by small quantizing noise effects that become "frozen" in the recirculating signal.

BRIEF DESCRIPTION OF THE DRAWINGS

Other objects, features and advantages of the invention will become apparent, and its construction and operation better understood, from the following detailed description, taken in conjunction with the accompanying drawings, in which.

DESCRIPTION OF A PREFERRED EMBODIMENT

According to the present invention, deadband effects inherent in a recursive filter operating according to the equation $x'=y+(l-a)(x-y)$, wherein x represents the input to the filter, y represents the output, and (1−a) is a fraction expressible as a multiplier of the difference (x−y) between the input and output, as a result of rounding of the product resulting from multiplication of (x−y) by said fraction, wherein the product is represented by a digital word which may have either positive or negative sense and should eventually decay to zero, are eliminated by truncating at the cycling frequency the absolute value of the product-representing word to the next lower digit by dropping n least significant digits where $R^n$ is the value of the divisor in radix R, and if any of the dropped digits is a "one" adding a "one" to the absolute value of the truncated digital word while retaining the sign of the pre-truncated word and repeating the process until the value of (x−y) becomes zero. That is, in the herein-described binary system instead of rounding the binary word representing the product, its absolute magnitude, which may have either positive or negative sense (depending upon which of x and y is the larger) is truncated to the next lower bit by dropping n least significant bits where $2^n$ is the value of the divisor, and if any of the dropped bits is a binary "1", a binary "1" is added to the truncated value while retaining the sign of the pretruncated word. For example, in a digital recursive filter of the type shown in FIG. 1 utilizing 8-bit PCM encoding of the video signal, and wherein (1−a) has a value of ⅛, it is convenient to simply divide (x−y) by the number eight (i.e., $2^3$) by dropping the three least significant bits of the 8-bit word; however, instead of adding the most significant of the dropped bits if it has a "1" to the absolute value of the truncated number (five bits) as is done in rounding, if any of the three least significant bits is a "1", a "1" is added to the absolute value of the truncated 5-bit word while retaining the sign of the pretruncated word and repeating the process, and when (x−y)=0, the three LSB's will all be zero.

Figure 3:
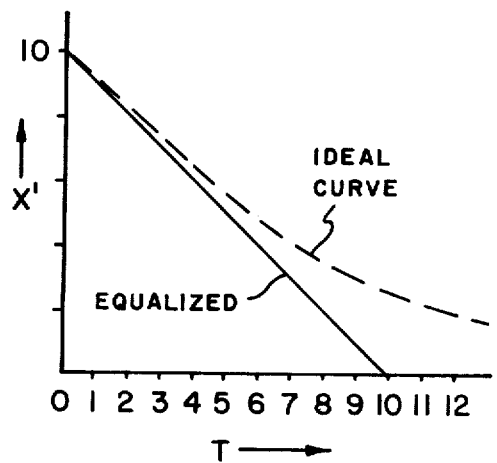
FIG. 3 is a set of curves illustrating the elimination of round-off errors achievable with the present invention.

That the above-described algorithm is effective in eliminating deadband will be evident from analysis of the following Table II in which, like in Table I, decimal numbers have been used for clarity of explanation, and the curves of FIG. 3.

TABLE II $x' = y + (1 − a)(x − y)$;  $a = 0.9$,  $(1 − a) = 0.1$

| T | x | y | (x − y) | 0.1 (x − y) | 0.1 (x − y) trunc. | 0.1 (x − y) trunc. ±1 | x' |
|---|---|---|---------|-------------|--------------------|----------------------|-----|
| 0 | 10 | 10 | 0 | 0 | 0 | 0 | 10 |
| 1 | 0 | 10 | −10 | −1.0 | −1 | −1 | 9 |
| 2 | 0 | 9 | −9 | −.9 | 0 | −1 | 8 |
| 3 | 0 | 8 | −8 | −.8 | 0 | −1 | 7 |
| 4 | 0 | 7 | −7 | −.7 | 0 | −1 | 6 |
| 5 | 0 | 6 | −6 | −.6 | 0 | −1 | 5 |
| 6 | 0 | 5 | −5 | −.5 | 0 | −1 | 4 |
| 7 | 0 | 4 | −4 | −.4 | 0 | −1 | 3 |
| 8 | 0 | 3 | −3 | −.3 | 0 | −1 | 2 |
| 9 | 0 | 2 | −2 | −.2 | 0 | −1 | 1 |
| 10 | 0 | 1 | −1 | −.1 | 0 | −1 | 0 |
| 11 | 0 | | | | | | |
| 12 | 0 | | | | | | |
| 13 | 0 | | | | | | |

Table II depicts the same conditions as Table I; that is, a=0.9, (1−a)=0.1, and the value of x abruptly changes from 10 to zero at T=1, except that instead of rounding, the quantity 0.1(x−y) is truncated by dropping the least significant digit (i.e., that to the right of the decimal point) and adding "1" to the absolute value of the truncated number while retaining the sign of (x−y) before truncation. If x is greater than y, obviously the sign is positive, and if x is less than y, the sign is negative. In this example selected for illustration, y is always greater than x, making the sign of (x−y) always negative. Comparison of Tables I and II reveals that at T=1 the rounded and truncated values of 0.1(x−y) are the same. At T=2, the untruncated value of 0.1(x−y) is −0.9; when rounded (Table I) it goes to 1, but when truncated (Table II) it goes to the next lowest integer, namely, zero. Because the sign of (x−y) is negative, −1 is substracted from the truncated value to give a value of −1, which when added to the then value of y, gives a value of 8 for x'. As the recursive process continues the value of x' ultimately goes to zero, in linear fashion, completely eliminating deadband. As will be seen from the FIG. 3 plot of the value of x' as a function of time, the resulting integration characteristic approaches the exponential curve of an RC integrator. Unlike the exponential characteristic of a true integrator, however, where the increments with time become diminishingly small, the present algorithm is linear in that it continues to add or subtract one least significant bit until the difference between x' (also y) and x vanishes. Once the difference goes to zero, achieving the elimination of deadband, the adding and/or substracting process stops.

Figure 1:
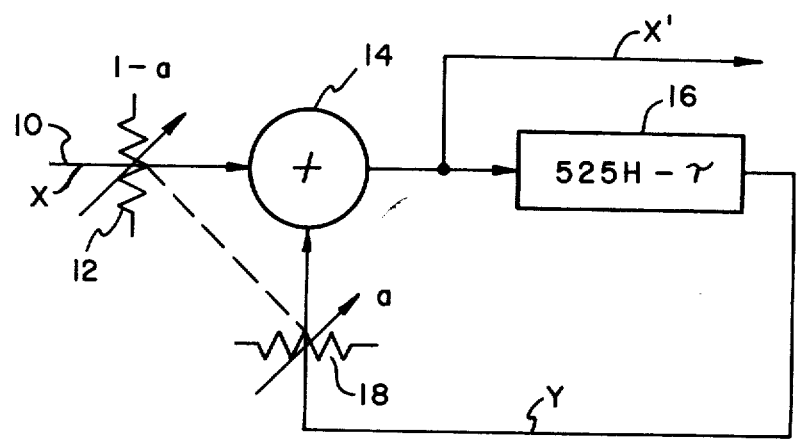
FIG. 1 is a block diagram of a recursive filter system to which reference has already been made.
Figure 2:
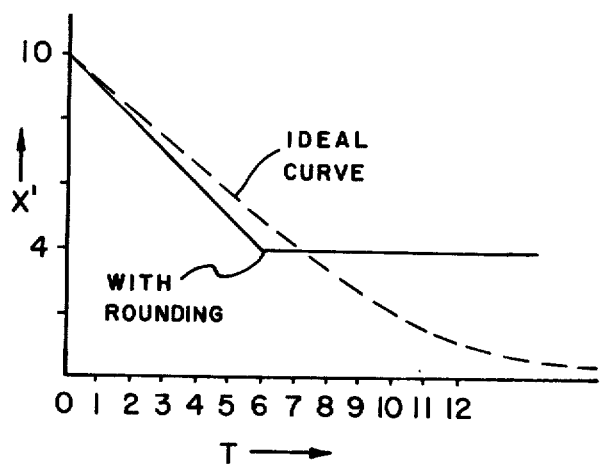
FIG. 2 is a set of curves illustrating the round-off error depicted in Table I, to which reference has already been made.
Figure 4:
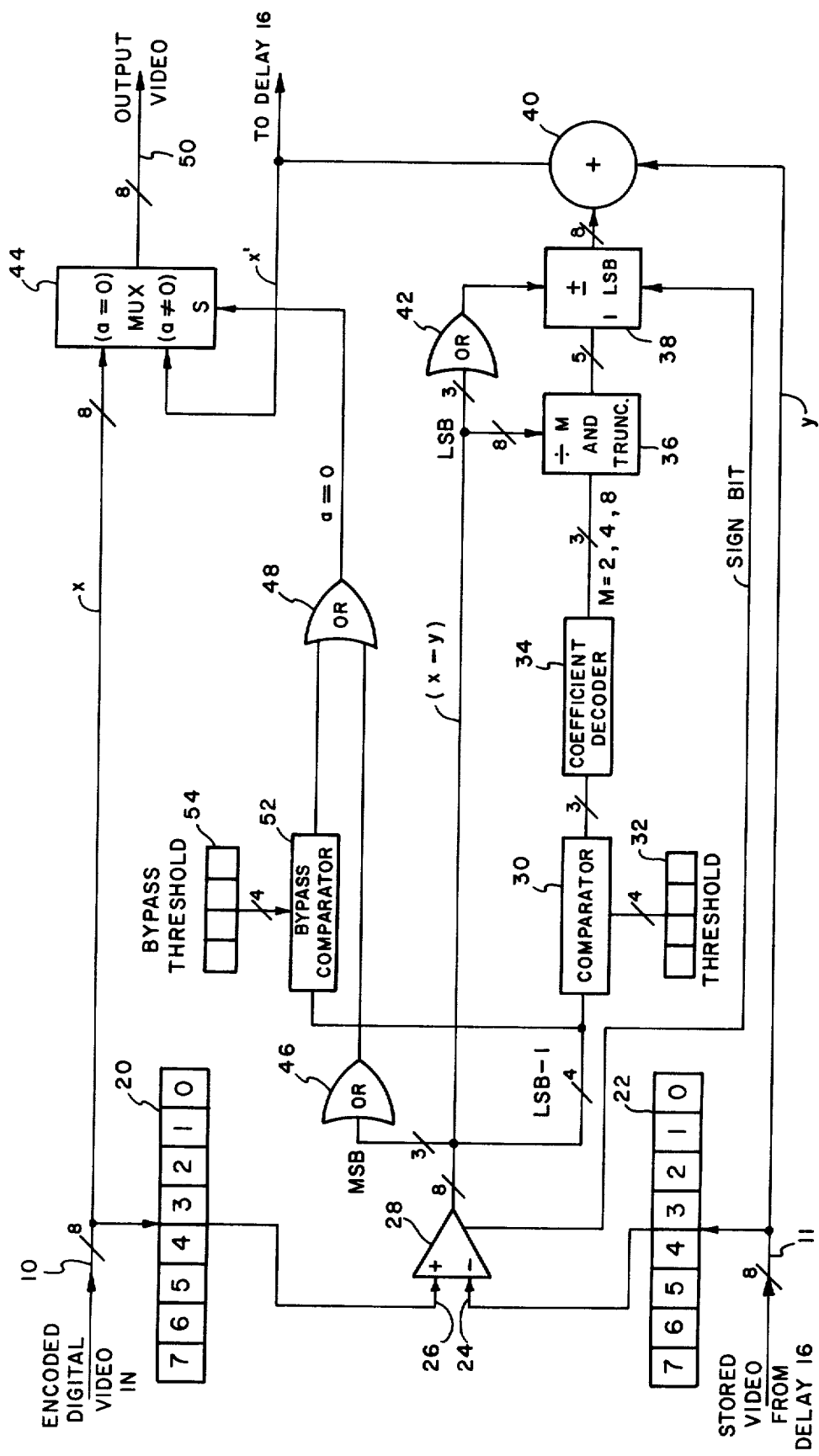
FIG. 4 is a functional block diagram of a circuit for evaluating motion between past and arriving video frames incorporating the present invention.

The principle illustrated by Table II and FIG. 3 is equally applicable to binary digital systems and will now be described as embodied in the motion evaluation system shown in FIG. 4 which, in essence, performs the function of summer 14 and the attenuators 12 and 18 schematically illustrated in FIG. 1. The input signal x is received on line 10 as an 8-bit PCM encoded signal, and the stored video signal y from the delay device 16 (also 8-bit PCM encoded) is received on line 11. The incoming video signal x is schematically shown at 20, the elements of which are labelled "0" for the least significant bit and "7" for the most significant bit. The stored video signal y is schematically shown at 22, the elements of which are also labelled "0" to "7" to represent the least and most significant bits, respectively.

In order to detect motion, the total past value of the stored video is compared element-by-element with the arriving video signal. That is, the 8-bit word that represents the amplitude of the total past signal in storage is compared bit-by-bit with the 8-bit word that represents the amplitude of the arriving video signal. More specifically, the words representing the stored and incoming video are applied to the − and + input terminals 24 and 26, respectively, of a difference amplifier 28, the output from which is an 8-bit word representative of the difference, if any, between the stored and present video signals. Difference amplifier 28 also delivers a ninth bit indicative of the sense of the difference signal, which is positive if x is the larger and is negative if y is larger. This ninth bit is designated the "sign bit", the purpose of which will soon become evident.

After discarding the least significant bit from the 8-bit word from difference amplifier 28 (i.e., the "0" bit) the next four least significant bits are applied to a comparator 30 which compares them to a 4-bit reference number, schematically illustrated 32, having a predetermined value much greater than zero. The output from comparator 30 is a 3-bit word, which is applied to a coefficient decoder 34 which is operative to determine the value of a coefficient "M" which, in essence, is the denominator of the fraction 1/M represented by (1−a) and determines the fractional amplitude proportion of the difference signal (x−y) to be added to the stored video signal. If the result of the comparison in comparator 30 is zero, meaning that the four least significant bits minus one of the 8-bit words from difference amplifier 28 is equal to the threshold number 32, this signifies that there is a predetermined difference between the stored video and the arriving video signals at this level of comparison. A given difference at the output of comparator 30 causes the coefficient decoder 34 to produce a coefficient "M" of a predetermined value, say, two, and depending on the difference number produced by comparator 30, is operative to produce one of additional values of "M" such as four, eight, etc. The coefficient M, in the form of a 3-bit digital word, is applied to a device diagrammatically shown at 36, to which the 8-bit difference signal $(x-y)$ is also applied, the device 36 being operative to divide the 8-bit word representing the value of $(x-y)$ by the coefficient M and truncating the quotient to the absolute value of the next lower digit by dropping n least significant bits where $2^n$ is the value of the divisor M. Thus, if $M=2$, only the least significant bit is dropped; if $M=4$, the two least significant bits are dropped; and if $M=8$, the three least significant bits are dropped. In the latter case, then, (which is illustrated in FIG. 4) device 36 delivers a 5-bit word representing the value of the 8-bit word divided by eight and truncated. This multi-bit word is applied to a device 38 which is operative to add or subtract therefrom, depending on the sense of the $(x-y)$ value, a binary "1" if any of the bits dropped during truncation is a binary "1". To this end, the three least significant bits of the 8-bit word representing the value of $(x-y)$ is applied to a 3-input OR circuit 42, the output of which is applied to device 38; if any of the three least significant bits is a "1", a "1" is applied to device 38 where it is added to the truncated word from device 36 if the sign bit, also applied to device 38, is positive, and subtracts a "1" from the truncated word if the sign bit is negative. This process continues at the cycling frequency of the recursive filter until all three of the least significant bits of the 8-bit $(x-y)$ word become zeros and remain so, signifying that a steady state has been reached at which the difference between x and y has become zero.

The output from device 38, an 8-bit word which represents the value of $(1-a)(x-y)$ in the aforementioned equation, is added in a summing device 40 to the y signal from delay device 16 to produce at its output an 8-bit word which represents the value of the signal x', which is again applied to delay device 16 and also as one input to a multiplexer 44, to which the incoming video signal x is also applied as a second input.

To take care of the possibility of there being no difference in bits 1–4 of the stored and arriving signals, yet a large difference actually existing between them which shows up in the more significant bits, another comparison is made between selected corresponding bits of the stored and arriving video. More particularly, the three most significant bits of the 8-bit word from difference amplifier 28 is applied to a 3-input OR circuit 46, and when there is a difference between any of the three most significant bits of the stored and arriving video, indicating that there is motion between them, OR circuit 46 applies a signal to one input of a second OR circuit 48 which, in turn, applies a signal to the switch terminal S of multiplexer 42 which effectively causes the coefficient "a" to go to zero. That is, if the motion exceeds a preset amount, none of the stored video is added to the arriving signal; instead, the arriving signal x only is transmitted to the output line 50.

Although not absolutely necessary for the operation of the system, a certain independence of action is afforded by making the value of coefficient "a" go to zero under certain conditions. More particularly, bits 1, 2, 3 and 4 of the $(x-y)$ signal from difference amplifier 28 are also applied to a bypass comparator 52 in which they are compared to a 4-bit bypass threshold number schematically shown at 54, which has a value somewhat greater than the value of the reference number 32. When bits 1–4 exceed the bypass threshold number, comparator 52 produces an output signal which is applied to a second input of OR circuit 48, which produces an output signal which is applied to the switch terminal of multiplexer 42 to effectively cause the value of coefficient "a" to go to zero. Thus, the coefficient "a" will go to zero, causing only the arriving video signal to be coupled to the output line 50, when (1) there is any difference between the three most significant bits of the stored and arriving video signals or (2) the difference between four less significant bits of the stored and arriving video signals exceeds a predetermined threshold number. Of course, when the value of coefficient "a" is other than zero, the 8-bit signal x' from summer 42 representing the value of the sum of the stored y signal and a fractional portion of the $(x-y)$ difference signal is coupled to the output line 50 by multiplexer 44.

From the foregoing description it is evident that there is provided in a noise reduction system which relies on picture element-by-picture element comparison of an arriving video signal with a stored video signal in a recursive filter environment, means for eliminating deadband effects inherent in a digital recursive filter as a result of rounding of the product resulting from multiplication of a number representing the difference between the input signal x and the output signal y by the coefficient $(1-a)$. Although the concept of deadband elimination has been described as applied to a digital system for reducing noise in color television signals, it is equally applicable to other digital recursive filters, whether hard-wired or computer-simulated under program control, wherein there is fractional multiplication of a number representing the difference between the input to the filter and its output. Also, although a specific implementation of the concept has been described, other implementations for accomplishing the desired function will now be evident to ones skilled in the art.

I claim:

1. Method of providing a digital recursive filter free of the deadband effects that would otherwise result from rounding of the product resulting from fractional multiplication of a number representing the difference between the input to the filter and the time-delayed output from the filter, wherein said product is represented by a digital word containing a plurality of digits, which word may have either positive or negative sense and which should eventually go to zero, comprising the steps of:
   (a) truncating to the next lower digit at the cycling frequency of the filter the absolute value of the product-representing word by dropping n least significant digits where $R^{-n}$ is the value of the multiplier in radix R,
   (b) if any of the dropped n least significant digits has a non-zero value adding to the absolute value of the truncated digital word a least significant "one", while retaining the sign of the pretruncated word, and
   (c) repeating steps (a) and (b) at the cycling frequency of the filter until the value of the difference between the input to the filter and the output from the filter becomes zero.

2. Method of providing a digital recursive filter having an input and an output, and a predetermined cycling frequency, which is free of the deadband effects that would otherwise result from rounding of the product resulting from a multiplication within the filter, wherein said product is represented by a multi-bit binary word which may have either positive or negative sense and which should eventually become zero, comprising the steps of:
  (a) truncating to the next lower digit at the cycling frequency of the filter the absolute value of the product-representing binary word by dropping n least significant bits thereof, where $2^{-n}$ is the value of the multiplier in radix 2,
  (b) examining the dropped n least significant bits at the cycling frequency of the filter to determine whether any is a binary "one",
  (c) determining at the cycling frequency of the filter the sign of the truncated binary word,
  (d) if the examination of step (b) reveals that any of the n dropped least significant bits is a binary "one", adding a least significant "one" to the truncated word while retaining the sign of the pre-truncated word, and
  (e) repeating steps (a), (b), (c) and (d) until the difference between the input to the filter and the output from the filter becomes zero.

3. In a digital system for reducing noise contained in digitally encoded input television signal x, which system includes storage means for storing a single television frame, summing means for adding the signal y delayed by said storage means to a fractional amplitude portion of the difference (x−y) between the input television signal x and the delayed signal y as a function of motion between the input signal and the stored signal to produce a noise-reduced output signal x', wherein said storage means and said summing means constitute a digital recursive filter operative at a predetermined cycling frequency according to the equation $x'=y+(1-a)(x-y)$, wherein (1−a) is the fraction 1/M, where M is an integer and varies in response to detected motion to correspondingly vary the fractional amplitude portion of the difference signal (x−y) added to the delayed signal y to produce the noise-reduced signal x', apparatus free from the deadband effects that would otherwise result from rounding of the quotient resulting from division of the digital number representing the value of the difference signal (x−y) by the integer M, and wherein the quotient is represented by a digital word which may have either positive or negative sense, said apparatus comprising:

means for repetitively dividing the digital word representing said difference signal (x−y) by M and for repetitively truncating to the next lower digit at said cycling frequency the absolute value of said quotient-representing digital word by dropping n least significant bits, where $R^n$ is the value of M in radix R, and means for determining whether any of the dropped n least significant digits is a "one" and, if so, adding a least significant "one" to the absolute value of the truncated digital word while retaining the sign of the pre-truncated digital word until the value of the difference between x and y becomes zero.

4. Apparatus according to claim 3, wherein said input television signal is pulse code modulated at a predetermined sampling rate,
  wherein said difference signal (x−y) is represented by a digital number representative of the measure difference, if any, between said input and delayed television signals, and
  wherein the valve of M is $2^n$ in radix 2.

* * * * *